United States Patent
Shindo et al.

(10) Patent No.: US 10,535,528 B2
(45) Date of Patent: Jan. 14, 2020

(54) METHOD OF FORMING TITANIUM OXIDE FILM AND METHOD OF FORMING HARD MASK

(71) Applicant: TOKYO ELECTRON LIMITED, Tokyo (JP)

(72) Inventors: Naoki Shindo, Nirasaki (JP); Toshio Hasegawa, Nirasaki (JP); Naotaka Noro, Nirasaki (JP); Miyako Kaneko, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 15/730,127

(22) Filed: Oct. 11, 2017

(65) Prior Publication Data

US 2018/0108534 A1  Apr. 19, 2018

(51) Int. Cl.
  *H01L 21/308* (2006.01)
  *H01L 21/02* (2006.01)

(52) U.S. Cl.
  CPC ...... *H01L 21/3086* (2013.01); *H01L 21/0223* (2013.01); *H01L 21/3081* (2013.01); *H01L 21/3088* (2013.01)

(58) Field of Classification Search
  CPC ............ H01L 21/3086; H01L 21/0223; H01L 21/3081; H01L 21/3088
  See application file for complete search history.

(56) References Cited

U.S. PATENT DOCUMENTS 8,623,770 B1 * 1/2014 Gao ................. H01L 21/02186
                                                                       257/E21.236

FOREIGN PATENT DOCUMENTS

| JP | 2012-517101 A | 7/2012 | |
| KR | 1020110104989 A | 9/2011 | |
| KR | 1020150038131 A | 4/2015 | |
| WO | WO 2008088015 A2 * | 8/2010 | ........... H01L 21/205 |

* cited by examiner

*Primary Examiner* — Duy Vu N Deo
(74) *Attorney, Agent, or Firm* — Nath, Goldberg & Meyer; Jerald L. Meyer

(57) ABSTRACT

A method for forming a titanium oxide film on a substrate to be processed, which has a silicon portion on a surface thereof, the method including: forming a first titanium oxide film on the surface of the substrate to be processed, which includes the silicon portion, by means of thermal ALD by alternately supplying a titanium-containing gas and a gas containing hydrogen and oxygen serving as an oxidizing agent in a first stage; and forming a second titanium oxide film on the first titanium oxide film by means of plasma ALD by alternately supplying a titanium-containing gas and plasma of an oxygen-containing gas as an oxidizing agent in a second stage.

13 Claims, 9 Drawing Sheets

METHOD OF FORMING TITANIUM OXIDE FILM AND METHOD OF FORMING HARD MASK

CROSS-REFERENCE TO RELATED APPLICATION

This application is based upon and claims the benefit of priority from Japanese Patent Application No. 2016-201538, filed on Oct. 13, 2016, the entire contents of which are incorporated herein by reference.

TECHNICAL FIELD

The present disclosure relates to a method of forming a titanium oxide film and a method for forming a hard mask.

BACKGROUND

In a semiconductor process, a titanium oxide film is widely used as a dielectric film or an insulating film, and there is a process for forming a titanium oxide film on silicon. This process is used, for example, in a technique called double patterning to form a fine pattern below a resolution limit of photolithography. In double patterning, for example, a core material made of Si is formed with a predetermined pattern width using photolithography, and a titanium oxide film serving as an uppermost hard mask is formed thereon. Subsequently, the titanium oxide film is etched to form sidewall spacers made of a titanium oxide film on the sidewall of the core material made of silicon. Next, the core material is removed by etching so that sidewall spacers made of a titanium oxide film remain as a hard mask. By using this as an etching mask, a film to be processed, which is formed using the same procedure, is anisotropically etched. This makes it possible to etch the film to be processed with a pattern width which is half the pattern width of the core material.

There are methods for forming titanium oxide using atomic layer deposition (ALD), in which a $TiCl_4$ gas and an oxidizing agent are alternately supplied to form a film. For example in a related art, a titanium oxide film is formed by a plasma ALD process in which a $TiCl_4$ gas, which is a Ti raw material gas, and plasma of an oxygen-containing gas, such as an $O_2$ gas, are alternately supplied.

However, in the method described above, although a titanium oxide film is obtained at a high film formation rate, an interfacial oxide film (a $SiO_2$ film) is formed to be relatively thick in a silicon portion after the formation of the titanium oxide film. Therefore, when the titanium oxide film is used as a hard mask for etching a predetermined film, there is a possibility that an error will occur in the pattern dimension of the film to be etched.

SUMMARY

Some embodiment of the present disclosure provide a method of forming a titanium oxide film, which enables the interfacial oxide film of the silicon portion to be thin while maintaining a high film formation rate, and further provide a method of forming a hard mask using the titanium oxide film.

According to one embodiment of the present disclosure, there is provided a method of forming a titanium oxide film on a substrate to be processed, which has a silicon portion on a surface thereof, the method including: forming a first titanium oxide film on the surface of the substrate to be processed, which includes the silicon portion, by means of thermal ALD by alternately supplying a titanium-containing gas and a gas containing hydrogen and oxygen serving as an oxidizing agent in a first stage; and forming a second titanium oxide film on the first titanium oxide film by means of plasma ALD by alternately supplying a titanium-containing gas and plasma of an oxygen-containing gas as an oxidizing agent in a second stage.

According to another embodiment of the present disclosure, there is provided a method of forming a hard mask for pattern-etching an etching target film in a substrate to be processed that has a silicon portion in a predetermined pattern and has the etching target film on a surface of the substrate to be processed, the method including: forming a first titanium oxide film on the surface of the substrate to be processed, which includes the silicon portion, by means of thermal ALD by alternately supplying a titanium-containing gas and a gas containing hydrogen and oxygen serving as an oxidizing agent in a first stage; forming a second titanium oxide film on the first titanium oxide film by means of plasma ALD by alternately supplying a titanium-containing gas and plasma of an oxygen-containing gas as an oxidizing agent in a second stage; and forming a hard mask in a predetermined pattern by etching a titanium oxide film including the first titanium oxide film formed in the first stage and the second titanium oxide film formed in the second stage.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Hereinafter, embodiments of the present disclosure will be described in detail with reference to the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

<Titanium Oxide Film Forming Method>

Figure 1:
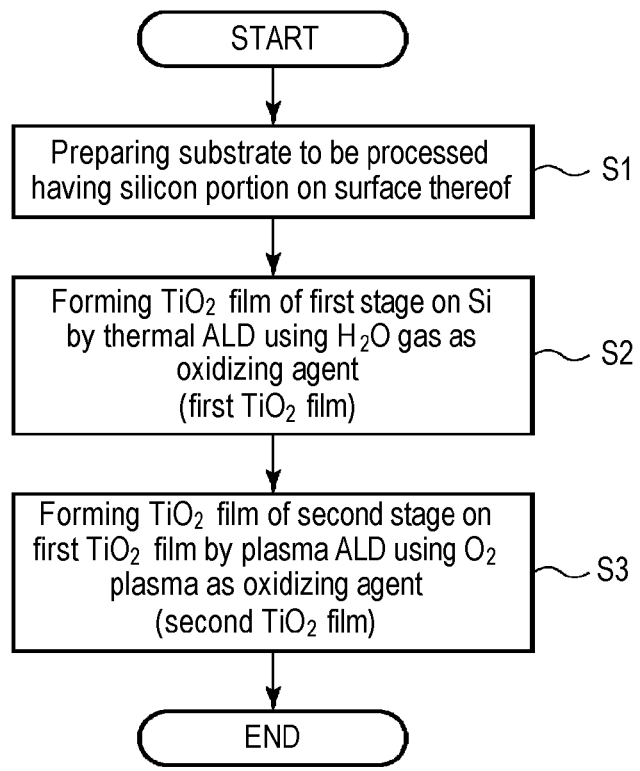
FIG. 1 is a flowchart showing an embodiment of a method for forming a $TiO_2$ film, according to the present disclosure.

First, one embodiment of a method for forming a titanium oxide film ($TiO_2$ film), according to the present disclosure, will be described with reference to the flowchart of FIG. 1.

In the present embodiment, a substrate to be processed, which has a silicon (Si) portion on its surface, is prepared (Step S1). As the substrate to be processed, a semiconductor substrate, such as a Si substrate, may be suitably used. The Si portion on the surface thereof may be a Si substrate itself, or may be a Si film. The Si film may be a poly-Si film formed by means of chemical vapor deposition (CVD).

Subsequently, a $TiO_2$ film of the first stage is formed on the substrate to be processed including the Si portion (Step S2). The formation of the $TiO_2$ film in the first stage is performed by means of a thermal ALD method, in which a Ti-containing gas (for example, a $TiCl_4$ gas) serving as a Ti raw material gas and a gas (for example, an $H_2O$ gas) containing hydrogen and oxygen, which is used as an oxidizing agent, are alternately supplied. As a result, the first $TiO_2$ film is conformally formed. In some embodiments, a process (for example, a purge process) may be performed to remove the gas remaining on the substrate to be processed between the supply of the Ti-containing gas and the supply of the $H_2O$ gas.

Subsequently, a $TiO_2$ film of the second stage is formed on the first $TiO_2$ film (Step S3). The formation of the $TiO_2$ film in the second stage is performed by a plasma ALD method in which a Ti-containing gas (for example, a $TiCl_4$ gas) serving as a Ti raw material gas and plasma of an $O_2$ gas ($O_2$ plasma) are alternately supplied. As a result, the second $TiO_2$ film is conformally formed. In some embodiments, a process (for example, a purge process) may be performed to remove the gas remaining on the substrate to be processed between the supply of the Ti-containing gas and the supply of the $O_2$ plasma.

By the two-stage film formation mentioned above, an interfacial oxide film of the Si portion can be controlled to be thin while maintaining a high film formation rate.

In the related art, as a method of forming a $TiO_2$ film on a Si portion, a plasma ALD method was proposed in which a $TiCl_4$ gas serving as a Ti raw material gas and $O_2$ plasma are alternately supplied. Thereby, a $TiO_2$ film was formed at a high film formation rate.

However, in this method, it has been found that the $O_2$ plasma has high oxidizing power, and an interfacial $SiO_2$ film is formed to be relatively thick in the Si portion when forming the $TiO_2$ film. Accordingly, when such a $TiO_2$ film is used as a hard mask to etch a predetermined film, an error occurs in pattern dimension.

Therefore, in the present embodiment, the first $TiO_2$ film is formed by means of a thermal ALD method in which a Ti-containing gas serving as a Ti raw material gas and an $H_2O$ gas serving as an oxidizing gas are alternately supplied in the first stage of film formation. Then, the second $TiO_2$ film is formed by means of a plasma ALD method in which a Ti-containing gas serving as a Ti raw material gas and an $O_2$ plasma are alternately supplied in the second stage of film formation.

In the first stage of film formation, since an $H_2O$ gas having a relatively low oxidizing power is used as an oxidizing agent without using plasma, oxidation of the Si portion can be suppressed. Therefore, formation of an interfacial $SiO_2$ film in the Si portion can be controlled to be thinner than a conventional one. However, since an $H_2O$ gas having low oxidizing power is used as an oxidizing agent in the first stage of film formation, the film formation rate of the first $TiO_2$ film becomes lower than that of the second $TiO_2$ film.

As in the conventional process, the film formation of the second stage after the film formation of the first stage is carried out at a high rate using plasma of an oxygen-containing gas, such as $O_2$ plasma, as an oxidizing agent, wherein the first $TiO_2$ film functions as a barrier so that the formation of the interfacial $SiO_2$ film can be suppressed during the second stage of film formation.

As described above, a combination of the weak oxidizing power of an $H_2O$ gas serving as an oxidizing agent in the first stage of film formation and a barrier function of the first $TiO_2$ film through film formation of the first stage can maintain the interfacial $SiO_2$ film of the Si portion to be thin when the second stage of film formation is subsequently performed at a high film formation rate. Accordingly, it is possible to form a $TiO_2$ film in which the interfacial $SiO_2$ film is suppressed, while maintaining a high film formation rate. Therefore, when such a $TiO_2$ film is used as a hard mask used when patterning a predetermined film, it is possible to reduce an error in pattern dimension of an etching target film.

The first stage of film formation in Step S2 is performed such that the first $TiO_2$ film has a thickness with which the first $TiO_2$ film may maintain the barrier function. From this viewpoint, the thickness of the first $TiO_2$ film may be 1 nm or more in some embodiments. In addition, even if the first $TiO_2$ film becomes too thick, only the total film formation rate is lowered, so the thickness thereof may be 6 nm or less in some embodiments.

In addition, a temperature of the substrate to be processed may be in a range of room temperature to 250 degrees C. in the first stage of film formation, in some embodiments.

Further, although an $H_2O$ gas is suitable as an oxidizing agent in the first stage of film formation, other gases {for example, hydrogen peroxide ($H_2O_2$) gas or the like} containing oxygen (O) and hydrogen (H) may be used, instead of an $H_2O$ gas.

The second stage of film formation in Step S3 is performed until the second $TiO_2$ film has a predetermined thickness.

Further, in some embodiments, the temperature of the substrate to be processed may be in a range of 50 to 250 degrees C. in the second stage of film formation.

In the second stage of film formation, the $O_2$ plasma is formed in order to generate oxygen radicals contributing to oxidation. The plasma is not particularly limited, and a variety of plasma, such as parallel flat plate plasma, inductively coupled plasma, microwave plasma, or remote plasma, may be applied.

In addition, although an $O_2$ gas is suitable as a plasma generating gas in the second stage of film formation, other oxygen-containing gas, such as an ozone gas, may be used.

In the first and second stages of film formation, although the Ti-containing gas serving as a Ti raw material gas may be a $TiCl_4$ gas, other Ti-containing gases, such as tetra (isopropoxy) titanium (TTIP), titanium tetrabromide ($TiBr_4$), titanium tetraiodide ($TiI_4$), tetrakisethylmethylaminotitanium (TEMAT), tetrakisdimethylaminotitanium (TDMAT), or tetrakisdiethylaminotitanium (TDEAT), may be used.

Although the film formation in the first and second stages may be performed in separate chambers, respectively, the film formation may be performed in the same chamber from the viewpoint of performing a process at a high throughput in some embodiments.

<Manufacturing Method of Hard Mask>

As described above, the $TiO_2$ film formed in the present embodiment may be applied to a hard mask used when patterning a predetermined film. Here, the hard mask is manufactured by a method including: forming the $TiO_2$ film of the first stage on the underlying Si layer in Step S2 described above; forming the $TiO_2$ film of the second stage in Step S3 described above; and producing a hard mask in a predetermined pattern by performing a predetermined patterning. At this time, the films may be formed conformally in the first stage and the second stage in some embodiments.

As an example, a case in which a $TiO_2$ film of the present embodiment is used as a hard mask of an uppermost layer in double patterning will be described.

Figure 2:
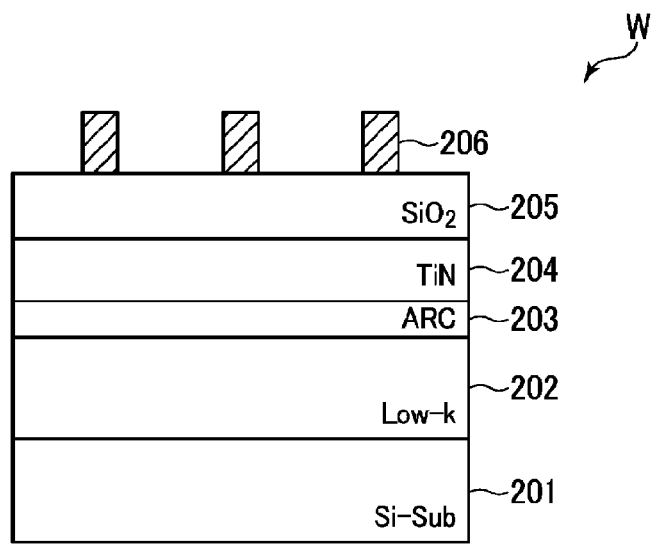
FIG. 2 is a view for explaining a structure of a substrate to be processed to which an example of a hard mask forming method of the present disclosure can be applied.

First, as shown in FIG. 2, a semiconductor wafer (W) is prepared as a substrate to be processed, in which a low-dielectric film (low-k film) 202, an antireflection coating (ARC) 203, a TiN film 204, and a TEOS film ($SiO_2$ film) 205, which are etching target films, are formed on a silicon substrate 201, and a Si film 206, as a core material, is formed thereon in a predetermined pattern by means of photolithography. A poly-Si film formed by CVD may be suitably used as the Si film 206.

Figure 3:
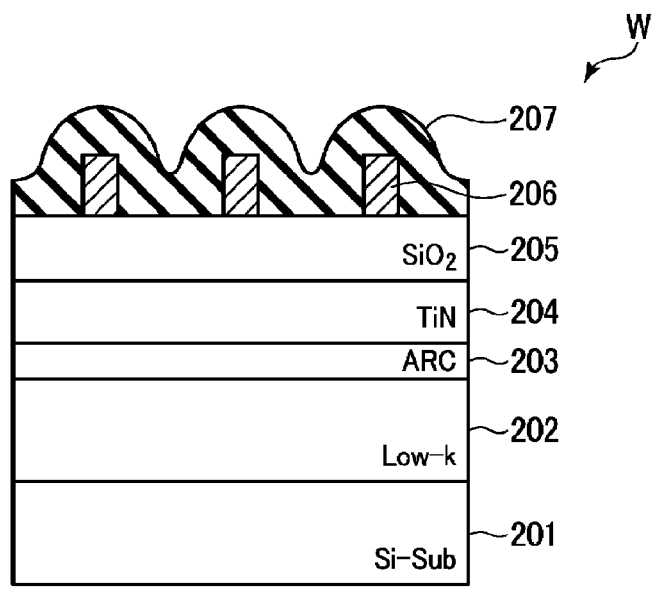
FIG. 3 is a cross-sectional view showing a state in which a $TiO_2$ film serving as an uppermost hard mask is formed on the substrate to be processed of FIG. 2.

Subsequently, as shown in FIG. 3, a $TiO_2$ film 207 serving as an uppermost hard mask is formed on the Si film 206 having a predetermined pattern. At this time, the $TiO_2$ film 207 is formed by a two-stage film forming method including the first stage of film formation and the second stage of film formation as described above.

Figure 4:
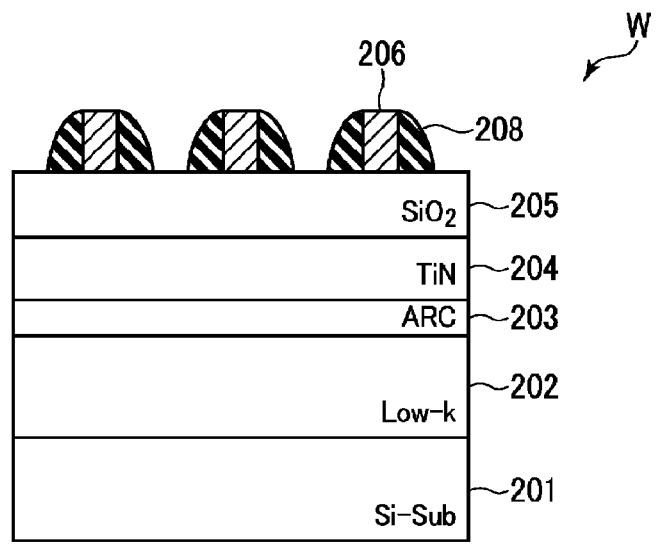
FIG. 4 is a cross-sectional view showing a state in which sidewall spacers serving as a hard mask are formed on both sides of a Si film as a core material through dry etching of a $TiO_2$ film in the state shown in FIG. 3.
Figure 5:
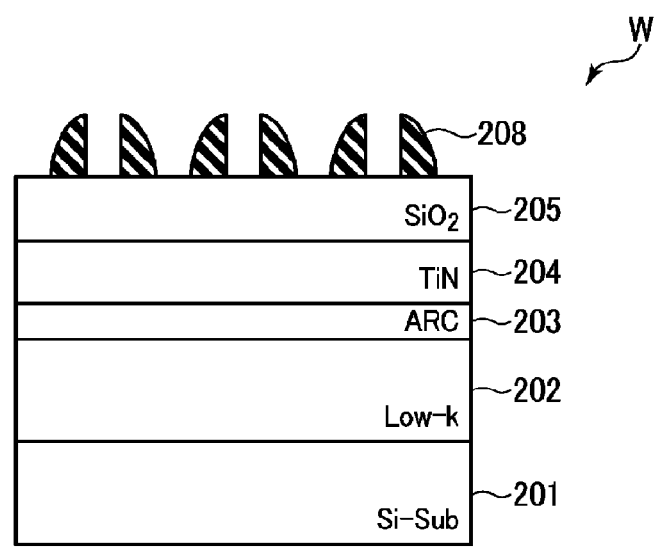
FIG. 5 is a cross-sectional view showing a state in which a Si film as a core material is removed by etching in the state shown in FIG. 4.

Subsequently, as shown in FIG. 4, sidewall spacers 208 are formed to have a pattern width which is half the pattern width of the Si film 206 as a core material on both sides of the Si film 206, which is a core material, through dry etching of the $TiO_2$ film 207. Then, as shown in FIG. 5, the Si film 206 as the core material is removed by etching, and the remaining sidewall spacers 208 are used as a hard mask.

Figure 6:
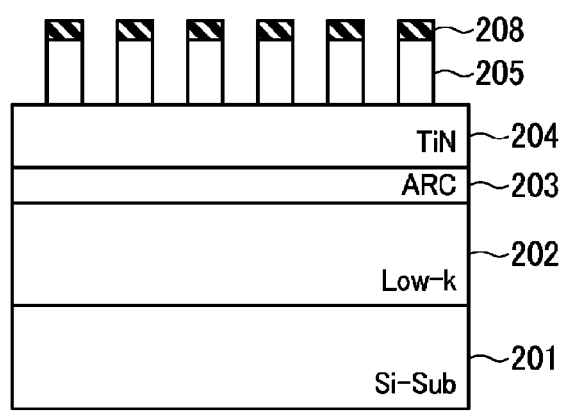
FIG. 6 is a cross-sectional view showing a state in which a pattern of the sidewall spacers is transferred by anisotropically etching an underlying TEOS film, using the sidewall spacer serving as the hard mask as an etching mask
Figure 7:
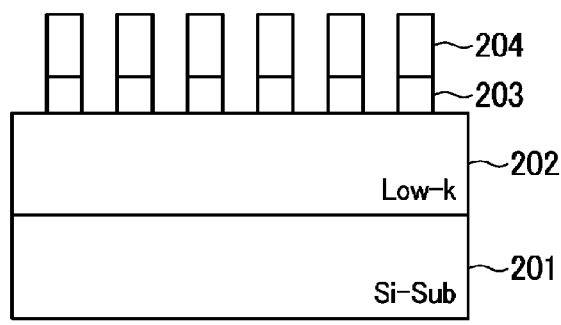
FIG. 7 is a cross-sectional view showing a state in which the pattern of FIG. 6 is transferred to a TiN film.
Figure 8:
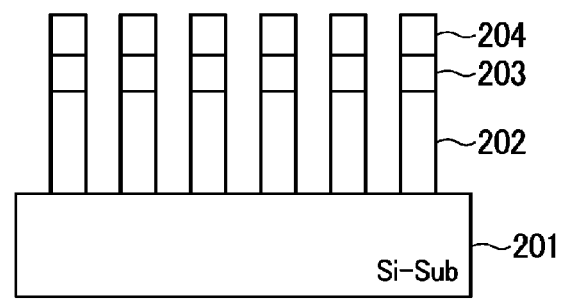
FIG. 8 is a cross-sectional view showing a state in which a low-k film, which is an etching target film, is etched using the TiN film of the pattern, which is obtained as shown in FIG. 7, as an etching mask.

Subsequently, as shown in FIG. 6, the underlying TEOS film ($SiO_2$ film) 205 is anisotropically etched using the sidewall spacers 208 serving as a hard mask as an etching mask in order to thereby transfer a pattern of the sidewall spacers 208. Then, the pattern is transferred to the TiN film 204 as shown in FIG. 7, and the low-k film 202, which is an etching target film, is etched using the TiN film 204 as an etching mask as shown in FIG. 8.

Figure 9:
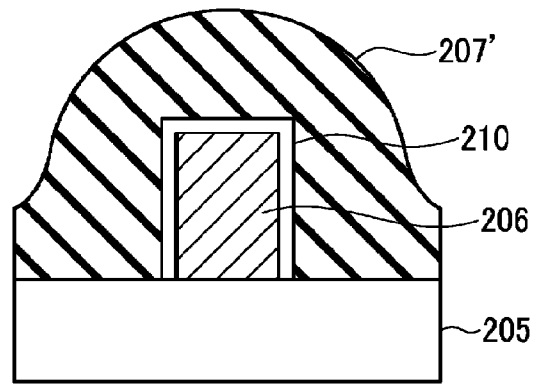
FIG. 9 is a cross-sectional view showing a state in which a $TiO_2$ film is formed on a Si film only by means of plasma ALD using plasma of an oxygen-containing gas, such as $O_2$ plasma, as an oxidizing agent.
Figure 10:
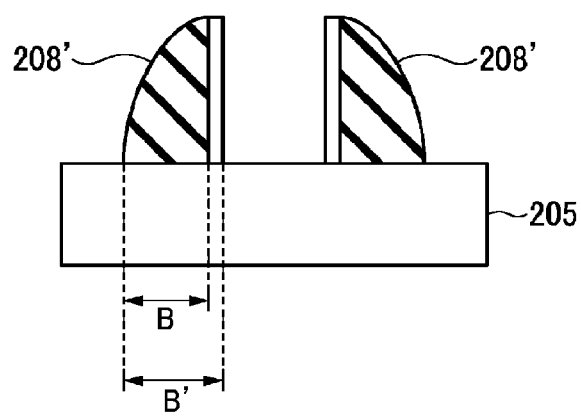
FIG. 10 is a cross-sectional view showing a state in which a Si film is removed by etching after sidewall spacers are formed through dry etching of a $TiO_2$ film in the state of FIG. 9.

In this double patterning, the pattern width of the sidewall spacer 208 obtained by forming and etching the uppermost $TiO_2$ film 207 is very important in improving pattern accuracy. However, as shown in FIG. 9, when a $TiO_2$ film 207' is formed only by plasma ALD using plasma of an oxygen-containing gas, such as $O_2$ plasma, as an oxidizing agent, an interfacial $SiO_2$ film 210 is formed to be relatively thick on an outer surface of the Si film 206. In this case, as shown in FIG. 10, when the $TiO_2$ film 207' is processed by means of dry etching to form sidewall spacers 208' and the Si film 206 is then removed by etching, the interfacial $SiO_2$ film 210 remains, without being etched. Therefore, the pattern width becomes B', which is greater than the original pattern width B of the sidewall spacer 208' serving as the hard mask, so that an error occurs in the pattern dimension.

Figure 11:
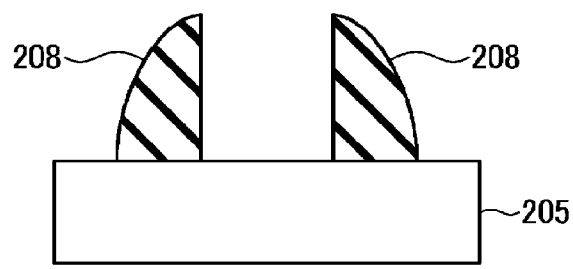
FIG. 11 is a cross-sectional view showing a state in which a $TiO_2$ film is formed on a Si film through two-stage film formation according to an embodiment of the present disclosure, and thereafter, the Si film is removed by etching after forming sidewall spacers through dry etching of the $TiO_2$ film.

In contrast, if the $TiO_2$ film 207 is formed by the two-stage film formation according to the present embodiment, an interfacial oxidation of the Si film 206 can be suppressed. Thereafter, when the $TiO_2$ film 207 is processed by means of dry etching to form the sidewall spacers 208 and the Si film 206 is then removed by etching, the interfacial $SiO_2$ film hardly remains, as shown in FIG. 11. Therefore, an error in the pattern dimension can be considerably reduced.

Experimental Example

Hereinafter, an experimental example will be described.

Here, the thickness of an interfacial $SiO_2$ film on Si was examined in the case where a $TiO_2$ film was formed on Si by means of thermal ALD while using a $TiCl_4$ gas as a Ti raw material gas and using $H_2O$ as an oxidizing agent (Case A) and in the case where a $TiO_2$ film was formed on Si by means of plasma ALD while using a $TiCl_4$ gas as the Ti raw material gas and using $O_2$ plasma as the oxidizing agent (Case B).

Specific film forming conditions for Cases A and B were as follows.

Figure 12:
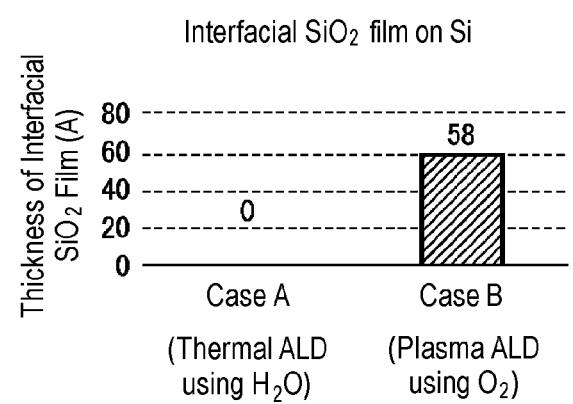
FIG. 12 is a view showing a thickness of an interfacial $SiO_2$ film formed on Si in the case where a $TiO_2$ film is formed on Si by means of thermal ALD using $H_2O$ as an oxidizing agent and in the case where a $TiO_2$ film is formed on Si by means of plasma ALD using $O_2$ plasma as an oxidizing agent.

(1) Case A
$H_2O$=300 sccm, $TiCl_4$=20 sccm, 4 Torr
(2) Case B
$O_2$ gas=1,000 sccm, $TiCl_4$=50 sccm,
RF=300 W, 2 Torr The results are shown in FIG. 12. As shown in FIG. 12, the interfacial oxide film was not formed in Case A in which the $TiO_2$ film was formed by means of the thermal ALD while using $H_2O$ as the oxidizing agent, whereas an interfacial oxide film was 58 Å thick in Case B in which the $TiO_2$ film was formed by means of the plasma ALD while using the $O_2$ plasma as the oxidizing agent. From this result, it is confirmed that the formation of the interfacial SiO$_2$ film on Si can be suppressed by using H$_2$O instead of the O$_2$ plasma as the oxidizing agent during the first stage of film formation.

<Apparatus for Forming TiO$_2$ Film>

Figure 13:
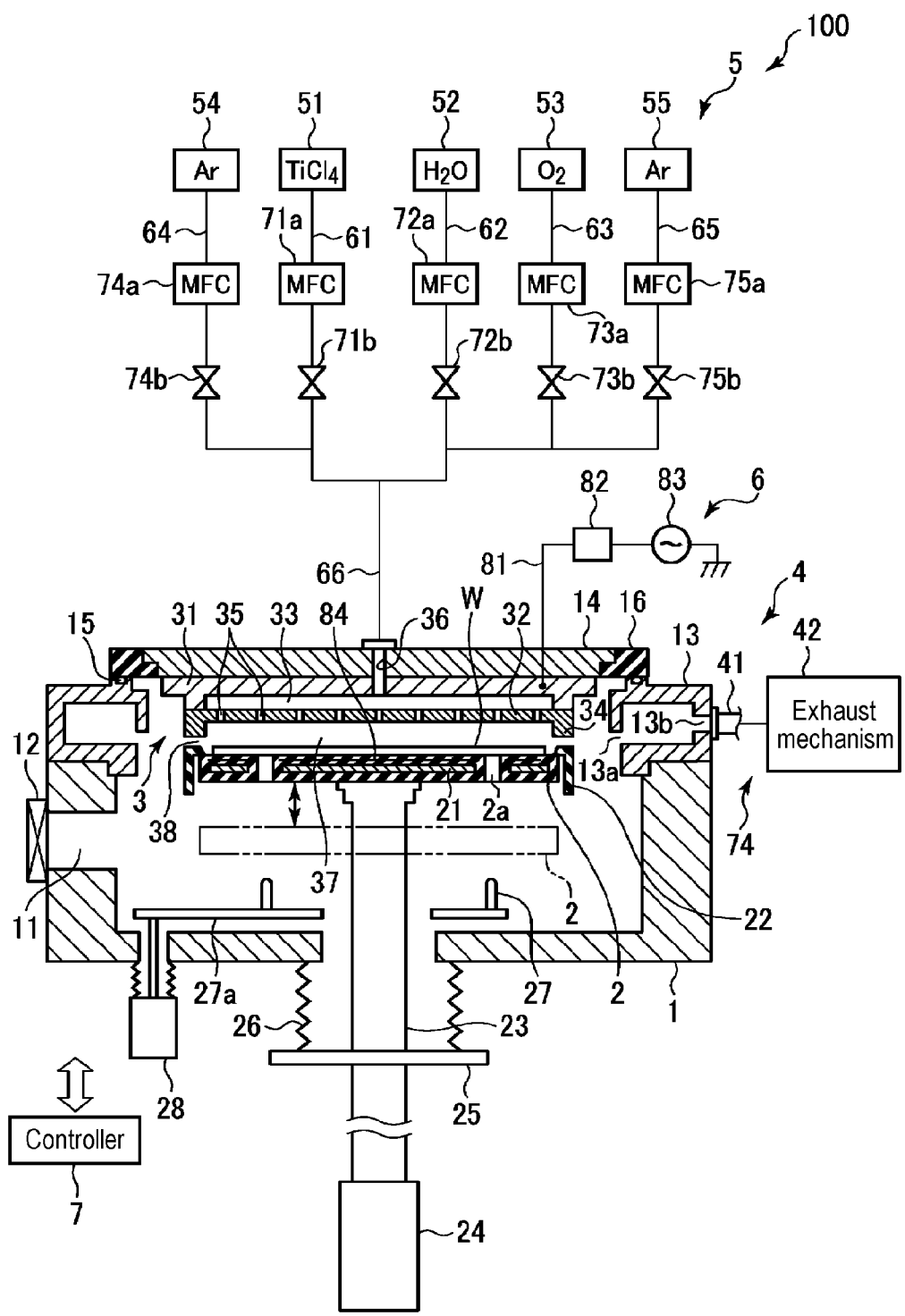
FIG. 13 is a cross-sectional view showing an example of a film forming apparatus suitable for a $TiO_2$ film forming method of the present disclosure.

Next, an example of a film forming apparatus suitable for the TiO$_2$ film forming method above will be described. FIG. 13 is a cross-sectional view showing an example of a film forming apparatus suitable for a TiO$_2$ film forming method of the present disclosure.

As shown in FIG. 13, the film forming apparatus 100 includes a chamber 1, a susceptor 2 for horizontally supporting a semiconductor wafer (W) (hereinafter, simply referred to as a wafer), which is a substrate to be processed in the chamber 1, a shower head 3 for supplying, to the chamber 1, process gases in the form of a shower, an exhaust part 4 for degassing the chamber 1, a process gas supply mechanism 5 for supplying process gases to the shower head 3, a plasma generating mechanism 6, and a controller 7.

The chamber 1 is made of a metal, such as aluminum, and has a substantially cylindrical shape. A loading/unloading gate 11 for loading and unloading the wafer (W) is formed on the sidewall of the chamber 1, and the loading/unloading gate 11 is opened and closed by a gate valve 12. An annular exhaust duct 13 having a rectangular cross-section is provided on a main body of the chamber 1. A slit 13a is formed in the exhaust duct 13 along an inner peripheral surface thereof. In addition, an exhaust outlet 13b is formed in an outer wall of the exhaust duct 13. A ceiling wall 14 is provided on an upper surface of the exhaust duct 13 to cover an upper opening of the chamber 1. An insulating ring 16 is inserted around an outer periphery of the ceiling wall 14, and a gap between the insulating ring 16 and the exhaust duct 13 is hermetically sealed by a sealing ring 15.

The susceptor 2 has a disk shape having a size corresponding to the wafer (W), and is supported by the support member 23. The susceptor 2 is made of a ceramics material, such as aluminum nitride (AlN), or a metal material, such as an aluminum-based or a nickel-based alloy, and a heater 21 for heating the wafer (W) is embedded therein. The heater 21 is supplied with power from a heater power source (not shown) to generate heat. In addition, the output of the heater 21 is controlled by a temperature signal from a thermocouple (not shown) provided near a wafer mounting surface on the upper surface of the susceptor 2, thereby controlling the wafer (W) to have a predetermined temperature.

The susceptor 2 is provided with a cover member 22 made of ceramics, such as alumina, so as to cover an outer peripheral portion of the wafer mounting surface and a side surface of the susceptor 2.

The support member 23 for supporting the susceptor 2 extends downwards through a hole formed in a bottom wall of the chamber 1 from a center of a bottom surface of the susceptor 2 and a lower end of the support member 23 is coupled to a lifting mechanism 24. Thus, the susceptor 2 supported by the support member 23 is moved up and down by the lifting mechanism 24 between a processing position shown in FIG. 13 and a transfer position therebelow which is indicated by a two-dot chain line. The wafer (W) may likewise, also be transferred. In addition, a flange member 25 is provided below the chamber 1 of the support member 23, and a bellows 26 is provided between a lower surface of the chamber 1 and the flange member 25 such that the bellows 26 separates an inner atmosphere of the chamber 1 from an outer atmosphere and stretches or contracts according to the elevating operation of the susceptor 2.

Three wafer support pins 27 (only two pins are shown in the drawing) are provided near the lower surface of the chamber 1 so as to protrude upwards from a lift plate 27a. The wafer support pins 27 are configured to be elevated by a lifting mechanism 28 provided below the chamber 1 by way of the lift plate 27a, and are configured to pass through openings 2a formed in the susceptor 2 in the transfer position so as to protrude or retract from an upper surface of the susceptor 2. By moving the wafer support pins 27 up and down as described above, the wafer (W) may be transferred between a wafer transfer mechanism (not shown) and the susceptor 2.

The shower head 3 made of a metal is provided to face the susceptor 2, and has a diameter substantially equal to that of the susceptor 2. The shower head 3 has a main body 31 fixed to the ceiling wall 14 of the chamber 1 and a shower plate 32 coupled to a lower portion of the main body 31. A gas diffusion space 33 is formed between the main body 31 and the shower plate 32. The gas diffusion space 33 is connected to a gas introducing hole 36 that is formed to pass through centers of the main body 31 and the ceiling wall 14 of the chamber 1. An annular protrusion 34 is formed to protrude downwards from a periphery of the shower plate 32, and gas discharge holes 35 are formed in an inner flat surface of the annular protrusion 34 of the shower plate 32.

When the susceptor 2 is in the processing position, a processing space 37 is formed between the shower plate 32 and the susceptor 2, and the annular protrusion 34 and an upper surface of the cover member 22 of the susceptor 2 approach each other to form an annular gap 38.

The exhaust part 4 includes an exhaust pipe 41 connected to the exhaust outlet 13b of the exhaust duct 13 and an exhaust mechanism 42 which is connected to the exhaust pipe 41 and includes a vacuum pump, a pressure control valve, or the like. During the processing, gases in the chamber 1 reach the exhaust duct 13 through the slit 13a to then be exhausted from the exhaust duct 13 by the exhaust mechanism 42 of the exhaust part 4 through the exhaust pipe 41.

A process gas supply mechanism 5 includes: a TiCl$_4$ gas supply source 51 for supplying a TiCl$_4$ gas as a Ti raw material gas; an H$_2$O gas supply source 52 for supplying an H$_2$O gas; an O$_2$ gas supply source 53 for supplying an O$_2$ gas; and a first Ar gas supply source 54 and a second Ar gas supply source 55 for supplying an Ar gas serving as a carrier gas, a purge gas, and a plasma generating gas. In addition, the process gas supply mechanism 5 further includes a TiCl$_4$ gas supply pipe 61 extending from the TiCl$_4$ gas supply source 51, an H$_2$O gas supply pipe 62 extending from the H$_2$O gas supply source 52, an O$_2$ gas supply pipe 63 extending from the O$_2$ gas supply source 53, a first Ar gas supply pipe 64 extending from the first Ar gas supply source 54, and a second Ar gas supply pipe 65 extending from the second Ar gas supply source 55.

The TiCl$_4$ gas supply pipe 61 and the H$_2$O gas supply pipe 62 join a merging pipe 66, and the merging pipe 66 is connected to the gas introducing hole 36 described above. In addition, the first Ar gas supply pipe 64 is connected to the TiCl$_4$ gas supply pipe 61, and the O$_2$ gas supply pipe 63 and the second Ar gas supply pipe 65 are connected to the H$_2$O gas supply pipe 62. A mass flow controller 71a and an opening/closing valve 71b, as a flow rate controller, are provided in the TiCl$_4$ gas supply pipe 61; a mass flow controller 72a and an opening/closing valve 72b are provided in the H$_2$O gas supply pipe 62; a mass flow controller 73a and an opening/closing valve 73b are provided in the O$_2$ gas supply pipe 63; a mass flow controller 74a and an opening/closing valve 74b are provided in the first Ar gas supply pipe 64; and a mass flow controller 75a and an opening/closing valve 75b are provided in the second Ar gas supply pipe 65.

In addition, a desired ALD process, to be described later, may be performed by switching the valves 71b, 72b, 73b, 74b and 75b.

Further, a flow rate of the Ar gas may be increased during a purge process by providing pipes branching off from the first Ar gas supply pipe 64 and the second Ar gas supply pipe 65, respectively, and used to increase the flow rate of the Ar gas only during the purging. In addition, the purge gas is not limited to an Ar gas, and may be other inert gases, such as a $N_2$ gas or rare gases other than Ar.

The plasma generating mechanism 6 includes a power supply line 81 connected to the main body 31 of the shower head 3, a matching device 82 and a high-frequency power source 83 connected to the power supply line 81, and an electrode 84 embedded in the susceptor 2. A high-frequency electric field is formed between the shower head 3 and the electrode 84 by supplying high-frequency electric power from the high-frequency electric power source 81 to the shower head 3, and plasma of a predetermined process gas is generated by means of the high-frequency electric field. The frequency of the high-frequency power source 83 may be set in the range of 200 kHz to 13.56 MHz, and is typically set to be 450 kHz.

The controller 7 includes a main controller including a computer (CPU) for controlling respective components (for example, valves, mass flow controllers, a power source, a heater, a vacuum pump, and the like) of the film forming apparatus, an input device, an output device, a display device, and a storage device. The storage device has a storage medium that is set to store parameters of various processes to be executed in the film forming apparatus 100 and programs (i.e., process recipes) for controlling processes executed in the film forming apparatus 100. The main controller calls a predetermined process recipe stored in the storage medium and controls the film forming apparatus 100 to perform a predetermined process based on the process recipe.

In the film forming apparatus 100 configured as described above, first, the gate valve 12 is opened and a wafer (W) is transferred into the chamber 1 by a transfer device (not shown) through the loading/unloading gate 11 to then be loaded on the susceptor 2. Then, the transfer device is retracted, and the susceptor 2 is lifted to the processing position. Then, the gate valve 12 is closed, and the temperature of the susceptor 2 is controlled to be a predetermined value by the heater 21 while keeping the interior of the chamber 1 at a predetermined reduced-pressure state.

In this state, a $TiO_2$ film is formed through the first stage of film formation and the second stage of film formation mentioned above.

Figure 14:
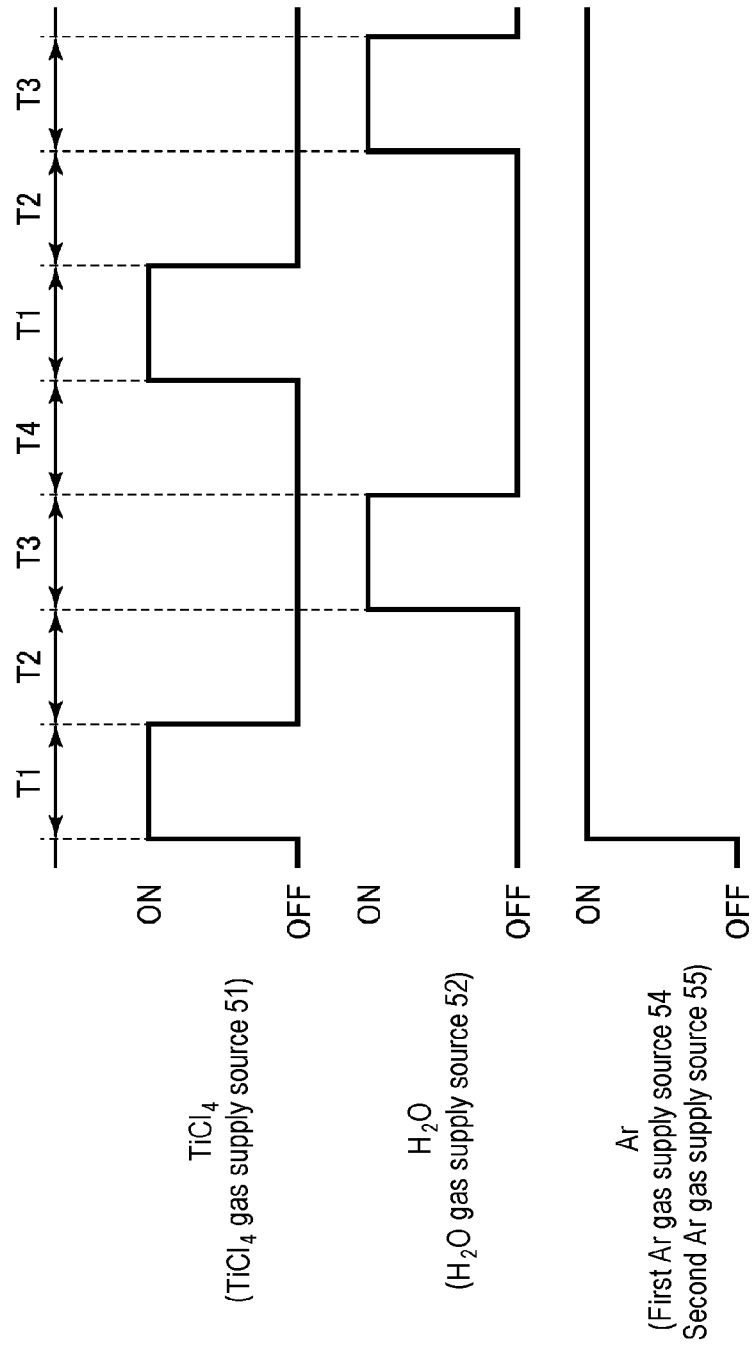
FIG. 14 is a timing chart showing a film formation sequence when forming a $TiO_2$ film in the first stage in the film forming apparatus of FIG. 13.

In the first stage of film formation, the valves 74b and 75b are opened to continuously supply the Ar gas from the first Ar gas supply source 54 and the second Ar gas supply source 55 while the valve 73b of the $O_2$ gas supply pipe 63 is closed. At the same time, the valve 71b of the $TiCl_4$ gas supply pipe 61 and the valve 72b of the $H_2O$ gas supply pipe 62 are intermittently and alternately opened and closed to sequentially and repeatedly perform a supply of ($Ar+TiCl_4$) gases in a period (T1), a supply of only an Ar gas in a period (T2), a supply of ($Ar+H_2O$) gases in a period (T3), and a supply of only an Ar gas in a period (T4), as shown in FIG. 14. Thereby, the first $TiO_2$ film is formed by means of thermal ALD by repeating the supply of the $TiCl_4$ gas, the purging of the chamber, the supply of the $H_2O$ gas, and the purging of the chamber.

Figure 15:
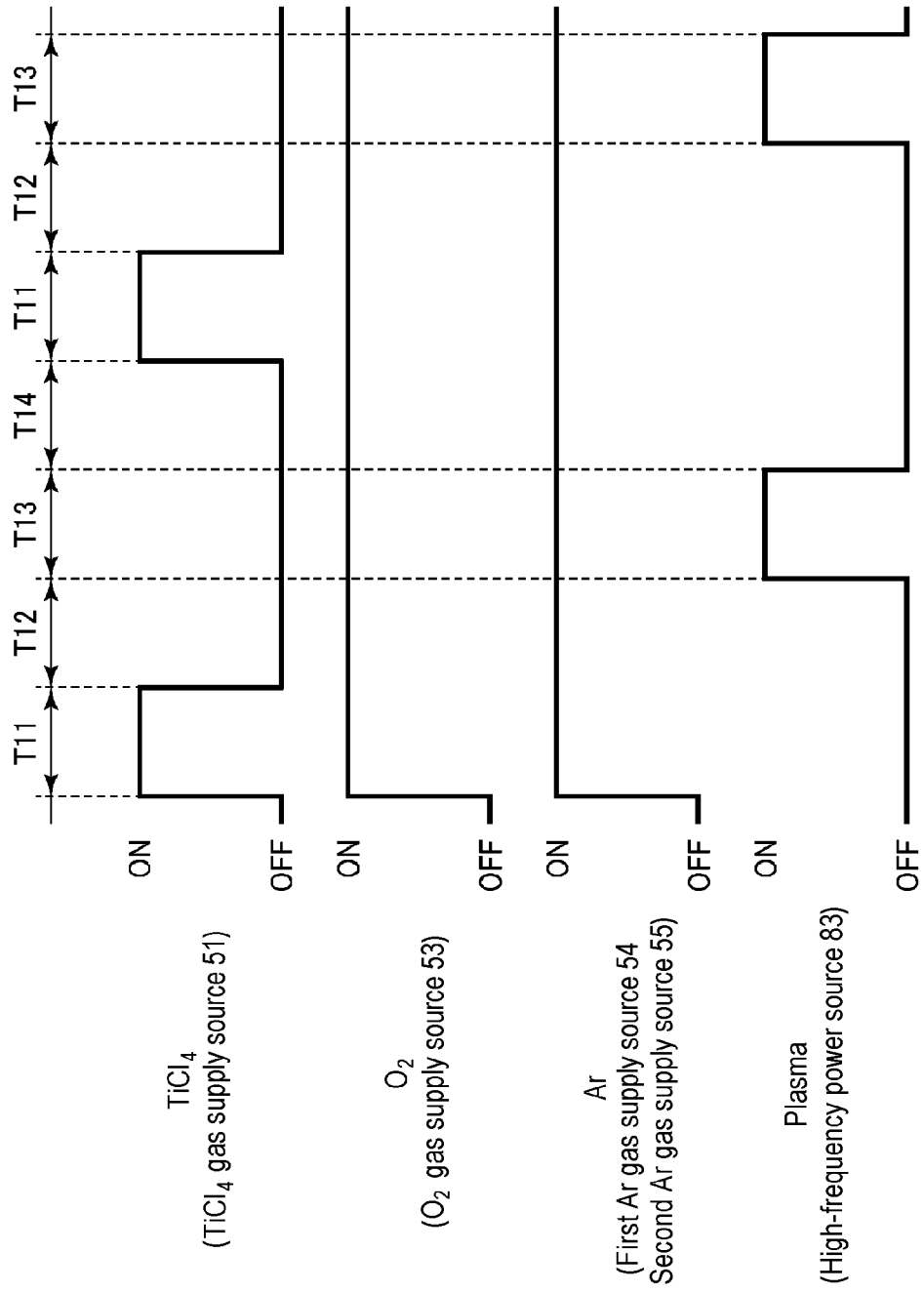
FIG. 15 is a timing chart showing a film formation sequence when forming a $TiO_2$ film in the second stage in the film forming apparatus of FIG. 13.

In the second stage of film formation after the first stage of film formation, as shown in FIG. 15, a supply of ($Ar+O_2+TiCl_4$) gases in a period (T11), a supply of ($Ar+O_2$) gases in a period (T12), a supply of plasma of an $O_2$ gas in a period (T13), and a supply of ($Ar+O_2$) gases in a period (T14) are sequentially and repeatedly performed by intermittently performing opening/closing of the valve 71b of the $TiCl_4$ gas supply pipe 61 and on/off switching of the high-frequency power source while: continuously supplying an Ar gas from the first Ar gas supply source 54 and the second Ar gas supply source 55 while opening the valves 74b and 75b; and opening the valve 73b to supply an $O_2$ gas from the $O_2$ gas supply source 53 continuously. Thereby, the second $TiO_2$ film is formed by means of the plasma ALD by repeating the supply of a $TiCl_4$ gas, the purging of the chamber, the supply of $O_2$ plasma, and the purging of the chamber. In addition, the purge period (T14) after the supply of $O_2$ plasma in the period (T13) may be short, or may be omitted depending on the cases.

After the $TiO_2$ film is formed through two stages as described above, the chamber 1 is purged, and the susceptor 2 is lowered to then unload the wafer (W) while opening the gate valve 12.

The processing conditions at this time are exemplified as follows.

(1) Film Formation of First Stage
Pressure: 1 to 10 Torr (133 to 1,333 Pa)
Temperature: Room temperature to 250 degrees C.
Flow rate of $TiCl_4$ gas: 5 to 100 sccm (mL/min)
Flow rate of $H_2O$ gas: 50 to 1,000 sccm (mL/min)
Flow rate of Ar gas: 1,000 to 10,000 sccm (mL/min)
Period T1 (each time): 0.01 to 0.5 sec
Period T3 (each time): 0.2 to 5 sec
Period T2 (purge) (each time): 0.05 to 2 sec
Period T4 (purge) (each time): 0.2 to 5 sec
(2) Film Formation of Second Stage
Pressure: 0.1 to 10 Torr (13 to 1,333 Pa)
Temperature: 50 to 250 degrees C.
Flow rate of $TiCl_4$ gas: 10 to 100 sccm (mL/min)
Flow rate of $O_2$ gas: 250 to 2,500 sccm (mL/min)
High-frequency power: 100 to 1,000 W
Flow rate of Ar gas: 2,000 to 10,000 sccm (mL/min)
Period T11 (each time): 0.01 to 0.5 sec
Period T13 (each time): 0.1 to 1.0 sec
Period T12 (purge) (each time): 0.05 to 1.0 sec
Period T14 (purge) (each time): 0 to 0.5 sec Since the $TiO_2$ film formation of the first stage and the $TiO_2$ film formation of the second stage can be continuously performed by the film forming apparatus 100, it is possible to form the film with high throughput.

OTHER APPLICATIONS

Although the embodiment of the present disclosure has been described above, the present disclosure is not limited to the above-described embodiment, and may be modified in various manners. For example, although a semiconductor wafer is used as an object to be processed in the above embodiment, anything that has silicon at least on its surface may be used as the object to be processed, and, for example, a compound semiconductor, a glass substrate, or a ceramic substrate, which has a silicon film formed thereon, may be used in the present disclosure.

In addition, although the above-described embodiment has shown the case where the $TiO_2$ film forming method of the present disclosure is applied to the formation of an upper hard mask in double patterning, the present disclosure is not limited thereto, and the present disclosure can be applied to the case where a hard mask is formed in a predetermined pattern on Si. Further, the present disclosure is not limited to the formation of a hard mask, and may be applied to all applications in which the interfacial oxidation of Si needs to be suppressed when a $TiO_2$ film is formed on Si.

According to the present disclosure, a titanium-containing gas and a gas containing hydrogen and oxygen serving as an oxidizing agent are alternately supplied to a surface including a silicon portion of a substrate to be processed to form the first titanium oxide film by means of the thermal ALD, and then a titanium-containing gas and plasma of an oxygen-containing gas as an oxidizing agent are alternately supplied to form a second titanium oxide film by means of the plasma ALD. Accordingly, since the interfacial oxidation hardly occurs in the silicon portion at the time when the first titanium oxide film is formed. Thereafter, even if the second titanium oxide film is formed by the plasma ALD, the first titanium oxide film acts as a barrier, so that a titanium film can be formed at a high rate while the interfacial oxidation of the silicon portion does not occur.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of forming a titanium oxide film on a substrate to be processed, which has a silicon portion on a surface thereof, the method comprising:
    forming a first titanium oxide film on the surface of the substrate to be processed, which includes the silicon portion, by means of thermal ALD by alternately supplying a titanium-containing gas and a gas containing hydrogen and oxygen serving as an oxidizing agent in a first stage; and
    forming a second titanium oxide film on the first titanium oxide film by means of plasma ALD by alternately supplying a titanium-containing gas and plasma of an oxygen-containing gas as an oxidizing agent in a second stage.

2. The method according to claim 1, wherein the forming a first titanium oxide film in the first stage is performed so as to suppress surface oxidation of the silicon portion so that the first titanium oxide film functions as a barrier of surface oxidation of the silicon portion when forming the second titanium oxide film in the second stage.

3. The method according to claim 1, wherein a titanium oxide film serving as a hard mask is formed.

4. The method according to claim 1, wherein the gas containing hydrogen and oxygen, which is used as the oxidizing agent when forming the first titanium oxide film in the first stage, is an $H_2O$ gas.

5. The method according to claim 1, wherein the plasma of the oxygen-containing gas, which is used as the oxidizing agent when forming the second titanium oxide film in the second stage, is plasma of an $O_2$ gas.

6. The method according to claim 1, wherein forming a first titanium oxide film in the first stage and forming a second titanium oxide film in the second stage are performed in the same chamber.

7. A method of forming a hard mask for pattern-etching an etching target film in a substrate to be processed that has a silicon portion in a predetermined pattern and has the etching target film on a surface of the substrate to be processed, the method comprising:
    forming a first titanium oxide film on the surface of the substrate to be processed, which includes the silicon portion, by means of thermal ALD by alternately supplying a titanium-containing gas and a gas containing hydrogen and oxygen serving as an oxidizing agent in a first stage;
    forming a second titanium oxide film on the first titanium oxide film by means of plasma ALD by alternately supplying a titanium-containing gas and plasma of an oxygen-containing gas as an oxidizing agent in a second stage; and
    forming a hard mask in a predetermined pattern by etching a titanium oxide film including the first titanium oxide film formed in the first stage and the second titanium oxide film formed in the second stage.

8. The method according to claim 7, wherein the silicon portion has a convex portion, and the hard mask is formed as a sidewall spacer of the convex portion in forming a hard mask.

9. The method according to claim 8, wherein the first titanium oxide film and the second titanium oxide film are conformally deposited on the convex portion.

10. The method according to claim 7, further comprising: removing the silicon portion by etching after forming a hard mask.

11. The method according to claim 7, wherein the gas containing hydrogen and oxygen, which is used as the oxidizing agent when forming the first titanium oxide film in the first stage, is an $H_2O$ gas.

12. The method according to claim 7, wherein the plasma of the oxygen-containing gas, which is used as the oxidizing agent when forming the second titanium oxide film in the second stage, is plasma of an $O_2$ gas.

13. The method according to claim 7, wherein forming a first titanium oxide film in the first stage and forming a second titanium oxide film in the second stage are performed in the same chamber.

* * * * *